United States Patent
Liu

(10) Patent No.: US 7,674,646 B2
(45) Date of Patent: *Mar. 9, 2010

(54) THREE DIMENSIONAL INTEGRATED PASSIVE DEVICE AND METHOD OF FABRICATION

(75) Inventor: Lianjun Liu, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 563 days.

This patent is subject to a terminal disclaimer.

(21) Appl. No.: 11/593,896

(22) Filed: Nov. 7, 2006

(65) Prior Publication Data

US 2008/0122560 A1    May 29, 2008

(51) Int. Cl.
*H01L 21/00* (2006.01)

(52) U.S. Cl. ............ 438/51; 333/262; 335/78; 257/E21.499

(58) Field of Classification Search .......... 438/50, 438/51; 333/262; 335/78
See application file for complete search history.

(56) References Cited

U.S. PATENT DOCUMENTS

| | | | |
|---|---|---|---|
| 6,228,675 B1 | 5/2001 | Ruby et al. | |
| 6,307,169 B1 | 10/2001 | Sun et al. | |
| 6,307,452 B1 | 10/2001 | Sun | |
| 6,370,404 B1* | 4/2002 | Shen | 505/210 |
| 6,384,353 B1 | 5/2002 | Huang et al. | |
| 6,507,475 B1 | 1/2003 | Sun | |
| 6,706,548 B2 | 3/2004 | Liu | |
| 6,794,101 B2 | 9/2004 | Liu et al. | |
| 7,088,201 B2* | 8/2006 | Piernas | 333/116 |
| 7,305,223 B2* | 12/2007 | Liu et al. | 455/333 |
| 2006/0141978 A1 | 6/2006 | Liu | |
| 2006/0141979 A1* | 6/2006 | Liu et al. | 455/333 |
| 2006/0180897 A1* | 8/2006 | Park et al. | 257/619 |
| 2008/0191293 A1* | 8/2008 | Liu et al. | 257/415 |

* cited by examiner

*Primary Examiner*—Walter L Lindsay, Jr.
*Assistant Examiner*—Reema Patel
(74) *Attorney, Agent, or Firm*—Meschkow & Gresham, PLC

(57) ABSTRACT

An integrated passive device (20) includes a first wafer (22), a first integrated device (28) formed on a first surface (24) of the wafer (22), and a second integrated device (30) formed on a second surface (26) of the wafer (22), the second surface (26) opposing the first surface (24). A microelectromechanical (MEMS) device (72) includes a second wafer (74) having a MEMS component (76) formed thereon. The integrated passive device (20) and the MEMS device (72) are coupled to form an IPD/MEMS stacked device (70) in accordance with a fabrication process (90). The fabrication process (90) calls for forming (94) the second integrated device (30) on the second surface (26) of the wafer (22), constructing (100) the MEMS component (76) on the wafer (74), coupling (104) the wafers (22, 74), then creating the first integrated device (28) on the first surface (24) of the first wafer (22).

5 Claims, 2 Drawing Sheets

THREE DIMENSIONAL INTEGRATED PASSIVE DEVICE AND METHOD OF FABRICATION

TECHNICAL FIELD OF THE INVENTION

The present invention relates generally to electronic devices. More specifically, the present invention relates to electronic devices fabricated using integrated passive device (IPD) technology.

BACKGROUND OF THE INVENTION

The explosion of growth in the portable wireless electronics industry has provided numerous challenges and opportunities for manufacturers of radio frequency (RF) components. The latest portable wireless telephony, data, and Internet access products demand greater functionality, higher performance, and lower cost in smaller and lighter formats. Additionally, wireless applications are spreading to new markets—from radar-equipped passenger vehicles to biomedical devices that, when injected or inserted, send data to a receiver outside the body. This demand has been satisfied in part by major advances in integrated circuit (IC) device technology and by the introduction of smaller packaging form factors, smaller discrete passive components, and high-density interconnection printed circuit card technologies.

The RF sections of portable wireless products call for a range of active device technologies combined with high-performance passive components. The ongoing development of active device integration and the trend toward greater functionality have placed great pressure on the need to integrate passive components. Indeed, as many as ninety-five percent of the components in a typical cellular telephone product can be passive components. Consequently, these passive components can occupy a large portion of the circuit board area and commensurately contribute to a large share of product assembly costs. Therefore, integrated passive device technologies hold great potential for significantly reducing circuit board area and product size and weight and/or for allowing increased functionality at a given product size.

Cellular phone radio transmitters use several passive components for functions such as filtering, impedance matching, and switching. For example, a harmonic filter is typically used for signal selectivity over radio bands, while an RF coupler may be used for signal level sensing and control. In conventional applications, a harmonic filter and an RF coupler are two distinct components, each of which adds to the overall device footprint. Recent innovations include the integration of the harmonic filter and the RF coupler on a surface of a semiconductor substrate, referred to as two-dimensional integration. The two-dimensional integration of these components can facilitate reduction of the footprint of the module and simplify fabrication processes relative to the use of two distinct components. In addition, the two-dimensional integration of these components can improve coupling performance, impedance matching, and other operating characteristics. Yet challenges remain in the further reduction of the device footprint and cost while concurrently simplifying fabrication processes and providing effective coupling and directionality.

Microelectromechanical systems (MEMS) components include microfabricated mechanical systems, such as switches, sensors, gyroscopes, and so forth, on a semiconductor chip. In general, MEMS technology is directed to the integration of mechanical elements, sensors, actuators, and electronics on a common substrate through the utilization of microfabrication technology. While associated electronics are fabricated using integrated circuit (IC) process sequences, the micromechanical components are fabricated using compatible micromachining processes that selectively etch away parts of a silicon wafer or add new structural layers (e.g., by deposition), to form the mechanical and electromechanical devices. In this way, MEMS represents a complete system-on-a-chip, free of discrete, macro-scale, moving mechanical parts.

The development of microelectromechanical systems (MEMS) components for wireless applications is growing due to their low cost, small area, and high performance. Indeed, in some applications such as an RF re-configurable system, the integration of MEMS devices with RF components, such as integrated passive devices, offers space and cost savings, higher performance and reliability, smaller form factors, and lower cost as a result of high-volume, high-yield IC-compatible processes relative to the use of discrete components. However, again challenges remain in further reducing the device footprint relative to the footprint achieved utilizing two-dimensional integration of integrated passive devices and MEMS components, reducing cost, and simplifying fabrication processes.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

In one embodiment, an electronic device includes a three-dimensional integrated passive device. This three-dimensional integrated passive device may include, for example, a radio frequency (RF) circuit, such as a harmonic filter, integrated with an RF coupler. However, the three-dimensional integrated passive device may alternatively or additionally include other passive and active devices configured in accordance with a desired application of the electronic device.

In another embodiment, the electronic device based upon a three-dimensional integrated passive device architecture may be combined with a microelectromechanical systems (MEMS) component in a stacked fashion. The resulting combination may be utilized within an RF MEMS-based reconfigurable front-end system for upcoming tunable RF modules that can transmit and decode numerous radio signals, e.g., Universal Mobile Telecommunications System, Time Division Multiple Access, Code Division Multiple Access, and Bluetooth. However, the present invention is not limited to use within a reconfigurable front-end system, but can be readily and cost effectively incorporated into existing and upcoming RF MEMS-based systems.

Figure 1:
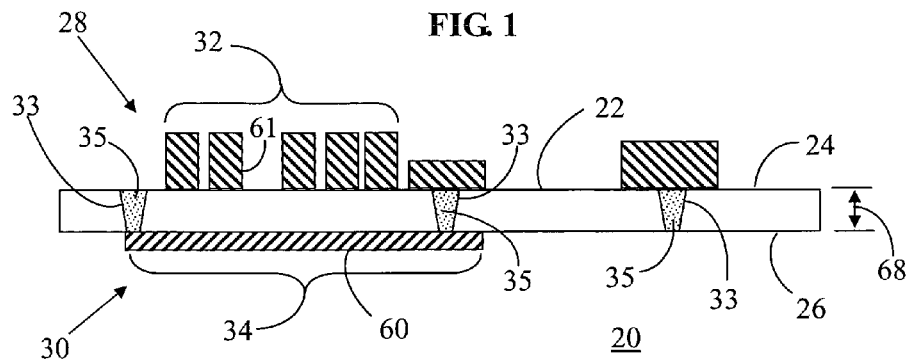
FIG. 1 shows a cross-sectional view of an electronic device in accordance with one embodiment of the present invention.

FIG. 1 shows a cross-sectional view of an electronic device 20 in accordance with one embodiment of the present invention. Electronic device 20 includes a wafer 22 having a first surface 24 and a second surface 26. A first integrated device 28 is formed on first surface 24 of wafer 22 and a second integrated device 30 is formed on second surface 26 of wafer 22.

As known to those skilled in the art, a wafer is typically a thin (approximately one half of a millimeter) disk of semiconductor material, such as silicon crystal, which contains a plurality of integrated circuits that form a uniform patchwork over a surface of the wafer, prior to their being cut free and packaged. The plurality of distinct integrated circuits are produced when cut or etched from the silicon wafer, although these integrated circuits are not ready for use until packaged and provided with external connections. These distinct integrated circuits are typically referred to as chips or die. For purposes of the present invention, wafer 22 of electronic device 20 is that portion of the silicon wafer semiconductor substrate populated by the integrated circuit that includes at least first and second integrated devices 28 and 30, respectively.

In one embodiment, first and second integrated devices 28 and 30, respectively, are integrated passive devices. A passive device is a device that does not require a source of energy for its operation. Examples of passive devices include resistors, capacitors, inductors, diodes, optical fibers, wires, filters, and so forth. Integrated passive devices can be used to effectively reduce component and module sizes. As used herein, an integrated passive device (IPD) is a passive electronic device or a passive electronic component that can be fabricated using semiconductor process technology. An IPD can be produced with very high precision, excellent reproducibility, and low cost in high quantities by utilizing semiconductor wafer processing technologies. Thus, electronic device 20 is a three-dimensional integrated passive device where three-dimensionally is achieved by fabrication of first integrated device 28 on first surface 24 of wafer 22 and fabrication of second integrated device 30 on the opposing second surface 26 of wafer 22. This three-dimensional integrated passive device architecture differs from conventional three-dimensional integrated circuits in which devices are fabricated in layers formed on only one side, or surface, of a wafer.

A layout of first integrated device 28 represents an IPD realization, where all of the depicted elements are formed on first surface 24 of wafer 22. A layout of second integrated device 30 represents another IPD realization, where all of the depicted elements are formed on second surface 26, i.e., the opposing side, of wafer 22. In accordance with one embodiment, first integrated device 28 is an RF circuit, and more particularly, a harmonic filter 32. Second integrated device 30 is an RF coupler 34.

One or more vias 33 may extend between first surface 24 and second surface 26 of wafer 22. A conductive material 35 is positioned in vias 33 to form an electrically conductive connection between first and second surfaces 24 and 26. Vias 33 are utilized for electrical connections between first integrated passive device 28 and second integrated device 30, as well as between any other devices on first surface 24 and any other components on or underlying second surface 26.

It should be understood that the inclusion of only one integrated device on each of first and second surfaces 24 and 26, respectively, is not a limitation of the present invention. Rather, each of first and second surfaces 24 and 26 may be populated with multiple integrated devices in accordance with a desired usage of electronic device 20. Furthermore, the use of only passive devices on each of first and second surfaces 24 and 26, respectively, is not a limitation of the present invention. First and second surfaces 24 and 26 may alternatively be populated with active devices or a combination of passive and active devices in accordance with a desired usage of electronic device 20.

Figure 2:
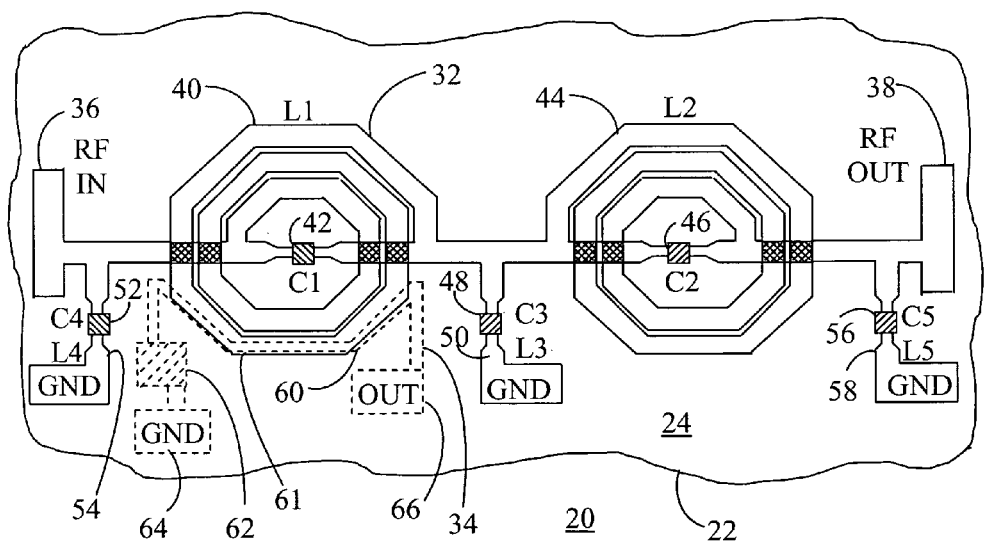
FIG. 2 shows a top view of the electronic device of FIG. 1 including an example integrated passive device (IPD) layout for a radio frequency (RF) circuit and an example IPD layout for an RF coupler formed on opposite surfaces of a common substrate.

FIG. 2 shows a top view of electronic device 20 including an example integrated passive device (IPD) layout for the RF circuit, i.e., harmonic filter 32, and an example IPD layout for RF coupler 34. Harmonic filter 32 is located on first surface 24 of wafer 22 and RF coupler 34 is located on second surface 26 (FIG. 1) of wafer 22. Accordingly, RF coupler 34 is represented with dashed lines in FIG. 2 to convey understanding of its location on the opposing, hidden, side of wafer 22.

An RF signal enters harmonic filter 32 at an input port 36 and a filtered RF signal within the desired RF band is provided at an output port 38. RF energy propagates over conductive traces formed on wafer 22. Harmonic content associated with the RF input signal is rejected by three harmonic resonance circuits. A first harmonic circuit is realized as an LC tank circuit (a first inductor 40, labeled L1, in parallel with a first capacitor 42, labeled C1). A second harmonic circuit is also realized as an LC tank circuit (a second inductor 44, labeled L2, in parallel with a second capacitor 46, labeled C2). The third harmonic circuit is realized as an LC series combination (a third capacitor 48, labeled C3, and a third inductor 50, labeled L3). Harmonic filter 32 also includes an input impedance matching circuit and an output impedance matching circuit. The input impedance matching circuit is realized as an LC series combination (a fourth capacitor 52, labeled C4, and a fourth inductor 54, labeled L4). Similarly, the output input impedance matching circuit is realized as an LC series combination (a fifth capacitor 56, labeled C5, and a fifth inductor 58, labeled L5). The specific inductor and capacitor values of harmonic filter 32 are selected according to the desired filtering characteristics and the desired output frequency band.

RF coupler 34 is formed on second surface 26 (FIG. 1) of wafer 22. In one embodiment, RF coupler 34 includes a conductive trace that forms a coupling section 60 located on second surface 26 directly below a suitably accessible RF signal line section 61 of harmonic filter 32 (see also FIG. 1). In this example, RF signal line section 61 is a portion of an input section of harmonic filter 32, i.e., the first harmonic circuit including first inductor 40 in parallel with a first capacitor 42, although such is not a limitation of the present invention.

A matching network 62 is coupled to a contact pad 64, which may be in communication with an off-chip ground pad. Matching network 62 is connected to one end of the conductive trace that forms coupling section 60 of RF coupler 34. In other words, one side (the isolation side) of RF coupler 34 is connected to ground via matching network 62. Matching network 62 may be realized as a terminating IPD resistor or a parallel combination of one or more IPD resistors and one or more IPD capacitors. The value of the components in matching network 62 are selected to provide a good impedance match to coupling sections 60, i.e., the conductive trace of RF coupler 34. A good impedance match is important to establish good coupler directivity. The other end of the conductive trace that forms coupling section 60 of RF coupler 34 may be connected to an output contact pad 66, which can be in communication with another contact pad or an off-chip element for providing the coupled RF signal.

The width of coupling section 60 is relatively narrow to establish a high impedance, thus reducing the need for impedance transformation at the coupled output port. Coupling section 60 may be formed from gold metallization that is approximately two micrometers wide. The amount of coupling achieved by RF coupler 34 is primarily dictated by the length of coupling section 60 and a separation gap 68 (see FIG. 1) between coupling section 60 and corresponding RF signal line section 61 of harmonic filter 32. Separation gap 68 should be consistent along the length of coupling section 60 to achieve effective coupling. Since harmonic filter 32 and RF coupler 34 are located on opposing surfaces of wafer 22, separation gap 68 is the thickness of wafer 22. Consistency along the width of wafer 22, i.e., separation gap 68, is assured due to stringent and known wafer manufacturing techniques.

The layouts of harmonic filter 32 and RF coupler 34 are presented above for illustrative purposes. However, those skilled in the art will recognize that the IPD realizations of each of harmonic filter 32 and RF coupler 34, located on opposing surfaces of wafer 22, can take on numerous forms.

Figure 3:
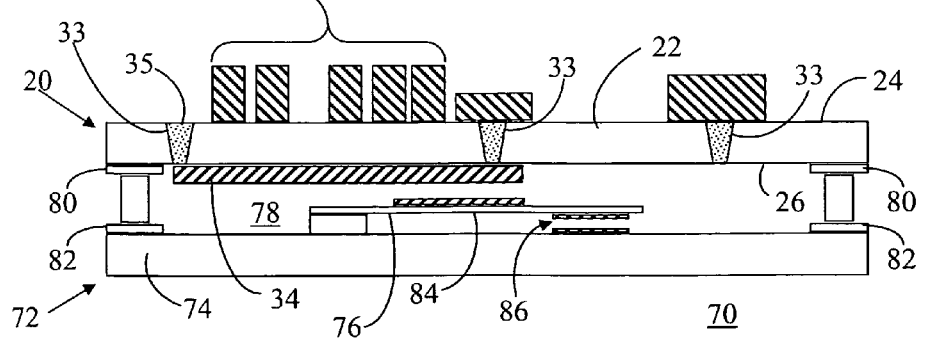
FIG. 3 shows a cross-sectional view of a second electronic device in accordance with another embodiment of the present invention.

FIG. 3 shows a cross-sectional view of a second electronic device, in the form if an IPD/MEMS stacked device 70, in accordance with another embodiment of the present invention. IPD/MEMS stacked device 70 includes electronic device 20 and a microelectromechanical systems (MEMS) device 72.

MEMS device 72 includes a second wafer 74 and a MEMS component 76 formed on second wafer 74. Second wafer 74 of MEMS device 72 is coupled to wafer 22 (which is referred to hereinafter as first wafer 22) of electronic device 20 to form a volume 78 between first wafer 22 and second wafer 74, and MEMS component 76 and RF coupler 34 are both located within volume 78. Thus, first wafer 22 serves as a lid for MEMS device 72 with second surface 26 facing second wafer 74.

Coupling of first wafer 22 and second wafer 74 may be achieved through application of a first bonding layer 80 on a bonding perimeter of second surface 26 of first wafer 22 and application of a second bonding layer 82 on a corresponding bonding perimeter of MEMS device 72. First and second bonding layers 80 and 82, respectively, may be metallic bond rings that couple to one another to form a hermetically sealed joint surrounding volume 78. First and second bonding layers 80 and 82 can be a number of different materials typically used for creating the hermetically sealed joint. Such materials include, for example, gold, indium, aluminum, copper, silver, alloys thereof, and compounds thereof. It should be understood, however, that if a hermetic seal is not desired, first and second bonding layers 80 and 82 may alternatively be formed from filled epoxies or filled silicones.

In this exemplary embodiment, MEMS component 76 is illustrated as a MEMS-based switch having a switch beam 84 formed on second wafer 74 and switch contacts 86. Although a MEMS-based switch is illustrated, MEMS component 76 can be any of a variety of existing and upcoming MEMS components. It should be understood that the inclusion of only MEMS component 76 on second wafer 74 is not a limitation of the present invention. Rather, MEMS device 72 may be further populated with mechanical elements, sensors, actuators, and electronics in accordance with a desired usage of MEMS device 72.

Figure 4:
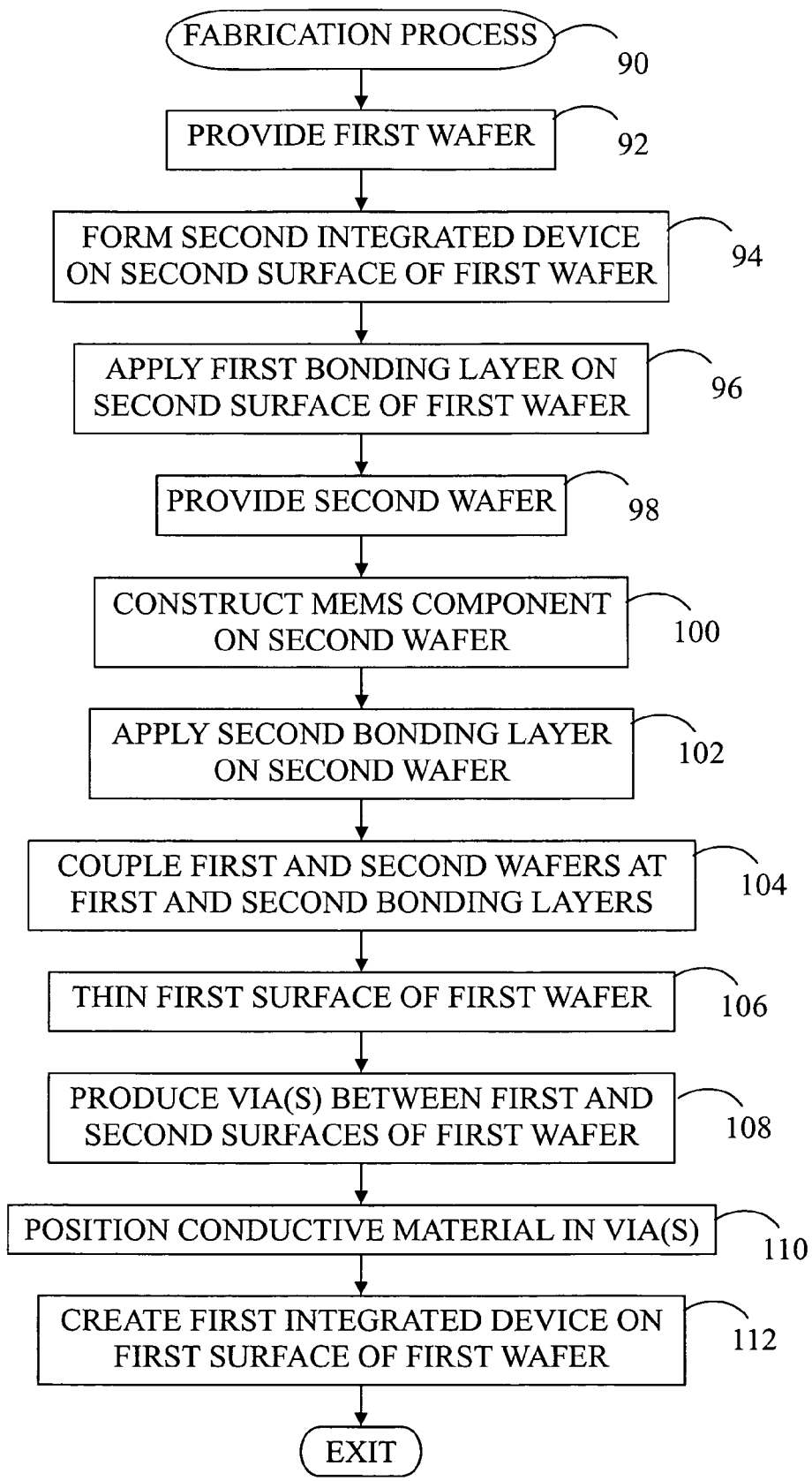
FIG. 4 shows a flow chart of a fabrication process for fabricating the second electronic device of FIG. 3.

FIG. 4 shows a flow chart of a fabrication process 90 for fabricating IPD/MEMS stacked device 70 (FIG. 3). MEMS devices, such as MEMS device 72 (FIG. 3), typically require a cavity package with a lid. Fabrication process 90 describes a cavity packaging technique in which electronic device 20 is utilized as a lid or cap for MEMS device 72. The stacking of MEMS device 72 with electronic device 20 as the lid makes the finished IPD/MEMS device 70 more compact and more cost effective then two-dimensional architectures. Fabrication process 90 is described below in connection with the fabrication of a single IPD/MEMS stacked device 70. However, it should be understood by those skilled in the art that the following process allows for concurrent wafer-level manufacturing of a plurality of IPD/MEMS stacked devices 70 at a time. The individual packaged devices 70 can then be cut, or diced, in a conventional manner to provide individual IPD/MEMS stacked devices 70 that are hermetically packaged.

Fabrication process 90 begins with a task 92. At task 92, first wafer 22 (FIG. 1) is provided. First wafer 22 may be fabricated from a pure semiconducting material grown into mono-crystalline cylindrical ingots up to approximately thirty-one centimeters in diameter utilizing conventional processes and is provided in thin wafers approximately one half to three quarters of a millimeter thick. These thin wafers are polished to obtain a very regular and flat surface. Silicon is the most commonly used semiconductor material in use, along with gallium arsenide, germanium, and some other materials.

Following task 92, a task 94 is performed. At task 94, second integrated device 30 (FIG. 1), in this example, RF coupler 34 (FIG. 1), is formed on second surface 26 of first wafer 22 using a semiconductor process technology. In accordance with known semiconductor fabrication techniques, RF coupler 34 and other structures may be formed on second surface 26 of first wafer 22 using one or more metal layers and dielectric layers. In accordance with one practical embodiment, RF coupler 34 may be formed in a metal layer that is approximately 0.6 to 2 micrometers thick. Performing task 94 prior to coupling first and second wafers 22 and 74 of IPD/MEMS stacked device 70 reduces the number of process steps required following the coupling of first and second wafers 22 and 74. As a result, the associated potential for device damage and/or degradation due to high temperature processing is reduced.

Next, a task 96 is performed. At task 96, first bonding layer 80 (FIG. 3) is applied on a bonding perimeter of second surface 26 of first wafer 22.

Following task 96, a task 98 is performed. At task 98, second wafer 74 is provided. Second wafer 74 is manufactured in much the same manner as that described in connection with task 92.

Fabrication process 90 continues with a task 100. At task 100, MEMS component 76 is constructed on second wafer 74 in accordance with known MEMS fabrication processes. These MEMS fabrication processes include, for example, deposition processes, photolithography, wet and dry etching processes, and bulk micromachining.

Following task 100, a task 102 is performed. At task 102, second bonding layer 82 (FIG. 3) is applied to a bonding perimeter of MEMS device 72 (FIG. 3). First and second bonding layers 80 and 82, respectively, may be chosen to achieve effective alloy bonding at a temperature less than that of other metals or components of MEMS component 76.

It should be noted that tasks 92, 94, and 96 pertain to the fabrication of electronic device 20 and tasks 98, 100, and 102 pertain to the fabrication of MEMS device 72. Accordingly, although they are described herein as being serial operations for simplicity, these distinct groups of operations may be performed in parallel in separate areas of a single manufacturing facility or these distinct groups of operations may be performed at different manufacturing facilities.

Fabrication process 90 continues with a task 104. At task 104, first and second wafers 22 and 74, respectively, are coupled at first and second bonding layers 80 and 82, respectively. Coupling may occur by heating first and second wafers 22 and 74 to achieve effective alloy bonding.

Following task 104, a task 106 is performed. At task 106, first surface 24 (FIG. 1) of first wafer 22 is thinned. Thinning entails the reduction of the thickness of first wafer 22 on first surface 24 by a process such as grinding or lapping and polishing. Thinning of first wafer 22 is performed in order to enable a reasonable through-wafer-via process. Handling a thinned wafer is typically performed by attaching it to a carrier wafer. However, since first and second wafers 22 and 74, respectively, were coupled at task 104, MEMS device 72 can conveniently and cost effectively serve as the carrier wafer for the thinned first wafer 22.

Next, a task 108 is performed. At task 108, one or more vias 33 (FIG. 1) are produced between first and second surfaces 24 and 26, respectively, of first wafer 22. Conventional photolithographic methods may be employed to form vias 33.

A task 110 is performed in connection with task 108. At task 110, conductive material 35 (FIG. 1) is positioned in vias 33. Conductive material 35 may be, for example, copper, gold, aluminum, alloys of copper, alloys of gold, and the like. As known to those skilled in the art, vias 33 need not be completely filled with conductive material 35. Rather, vias 33 can be partially filled as long as electrical contact can be made from first surface 24 (FIG. 1) to second surface 26 (FIG. 1) of first wafer 22.

Following task 110, a task 112 is performed. At task 112, first integrated device 28, in this example, harmonic filter 32 (FIG. 2) is created on first surface 24 of first wafer 22 using a semiconductor process technology. In accordance with known semiconductor fabrication techniques, harmonic filter 32 and other elements of the RF circuit may be formed on first surface 24 of first wafer 22 using one or more metal layers and dielectric layers. In accordance with one practical embodiment, harmonic filter 32 may be created on first surface 24 of first wafer 22 using a plurality of metal layers and a number of dielectric layers. The metal layers are deposited and the desired conductive traces are etched or otherwise formed from the metal layers. The metal layers are typically referred to as "metal 1," "metal 2," "metal 3," and so on to indicate the order in which they are deposited or formed onto first surface 24 of first wafer 22 during creation task 112. In accordance with one practical embodiment, at least portions of the IPD capacitors and resistors are formed from the metal 2 layer and the loops of IPD inductors, i.e., first and second inductors 40 and 44, respectively (FIG. 1), are formed from the metal 3 layer. In accordance with one practical semiconductor process technology, metal 1 elements are approximately 0.6 to 2 micrometers thick, metal 2 elements are approximately 2.5 micrometers thick, and metal 3 elements are approximately 10 micrometers thick.

First integrated device 28 is created on first surface 24 of first wafer 22 at task 112 following wafer coupling task 104 because the loops of first and second inductors 40 and 44 are necessarily thick to achieve high quality inductance. If the thick metal loops of first and second inductors 40 and 44 were created prior to wafer coupling in IPD/MEMS stacked device 70 (FIG. 3), then formation of the thick metal pattern could interfere with the bonding gap control and MEMS device 72 (FIG. 3). In addition, the same fabrication process step 112 for creation of first and second inductors 40 and 44 can be shared with the fabrication of interconnect lines and the bonding pad on first surface 24, thereby enhancing fabrication efficiency. Moreover, the prior art integrated harmonic filter and RF coupler on a common surface of a wafer calls for high temperature (in excess of 350 degrees Celsius) thin film deposition processing. This high temperature processing could damage first and second bonding layers 80 and 82, respectively, (FIG. 3) and/or degrade MEMS component 76 (FIG. 3) if this prior art integrated harmonic filter and RF coupler were built on first surface 24 of wafer 22 following wafer coupling task 104. Consequently, the formation of RF coupler 34 on second surface 26 (FIG. 1) of wafer 22 at the earlier task 94 and then the subsequent creation of first integrated device 28 on first surface 24 at task 112 following wafer bonding task 104 eliminates the need for the potentially damaging high temperature thin film deposition processing of the prior art.

An embodiment described herein comprises a three-dimensional integrated passive device (IPD) that includes separate integrated passive devices formed on opposing surfaces of a wafer. The integrated passive devices include an RF circuit on a first surface of a wafer and an integrated RF coupler on the opposing second surface of the wafer. This three-dimensional integrated passive device is integrated with a microelectromechanical systems (MEMS) device to form an IPD/MEMS stacked device. The three-dimensional architecture of the IPD and the stacked configuration of the IPD/MEMS stacked device provide benefits including improved packing density, noise immunity, improved total power due to reduced wire length/lower capacitance, superior performance, and the ability to implement added functionality.

Another embodiment comprises a method for fabricating the three-dimensional IPD and the IPD/MEMS stacked device. The fabrication methodology for the three-dimensional structure of the IPD simplifies the overall process, improves yield, and reduces manufacturing costs. The fabrication methodology for the IPD/MEMS stacked device simplifies the process flow for integration of an IPD harmonic filter, RF coupler, and MEMS devices by maximizing the utilization of existing processing steps and carrying out several of the processing steps before the IPD is bonded to the MEMS device and thinned.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for fabricating an electronic device comprising:
   providing a wafer;
   creating a first integrated device on a first surface of said wafer using a semiconductor process technology, said creating operation forming said first integrated device as an RF circuit having an RF signal line section;
   forming a second integrated device on a second surface of said wafer using said semiconductor process technology, said forming operation forming said second integrated device as an RF coupler having a coupling section; and
   locating said coupling section on said second surface below said RF signal line section.

2. A method as claimed in claim 1 wherein said creating operation forms said RF circuit as a harmonic filter.

3. A method for fabricating an electronic device comprising:
   providing a first wafer and a second wafer;
   creating a first integrated passive device on a first surface of said first wafer using a semiconductor process technology, said first integrated passive device including an RF circuit having an RF signal line section;
   forming a second integrated passive device on a second surface of said first wafer using said semiconductor process technology, said second integrated passive device including an RF coupler having a coupling section;
   locating said coupling section on said second surface below said RF signal line section;

constructing a microelectromechanical systems (MEMS) component on said second wafer; and coupling said second wafer to said first wafer to form a volume between said first and second wafers with said MEMS component being located in said volume.

4. A method as claimed in claim 3 further comprising:

performing said forming and coupling operations prior to said creating operation; and thinning said first surface of said first wafer following said coupling operation and prior to said creating operation.

5. A method as claimed in claim 3 further comprising:

following said coupling of said first and second wafers, producing a via between said first and second surfaces of said first wafer; and positioning a conductive material in said via to form a connection between said first and second surfaces of said first wafer.

* * * * *